United States Patent [19]
Kaifler et al.

[11] Patent Number: 5,638,021
[45] Date of Patent: Jun. 10, 1997

[54] POWER SEMICONDUCTOR COMPONENT WITH TEMPERATURE SENSOR

[75] Inventors: Erich Kaifler, Taufkirchen; Jenoe Tihanyi, Kirchheim, both of Germany

[73] Assignee: Siemens Aktiengesellschaft, Munich, Germany

[21] Appl. No.: 376,249

[22] Filed: Jan. 23, 1995

[30] Foreign Application Priority Data

Jan. 24, 1994 [DE] Germany .......................... 44 01 956.4

[51] Int. Cl.$^6$ .................................................. H01L 35/00
[52] U.S. Cl. ........................ 327/513; 361/106; 361/75
[58] Field of Search .................................... 327/545, 546, 327/512, 513; 361/26, 27, 59, 75, 105, 106

[56] References Cited

U.S. PATENT DOCUMENTS

| | | | |
|---|---|---|---|
| 4,281,358 | 7/1981 | Plouffe et al. | 361/106 |
| 4,926,283 | 5/1990 | Qualich | 327/512 |
| 4,937,646 | 6/1990 | Tihanyi et al. | 357/43 |
| 5,029,039 | 7/1991 | Yeh | 361/59 |
| 5,457,419 | 10/1995 | Tihanyi | 327/512 |

FOREIGN PATENT DOCUMENTS 0208970  5/1990  European Pat. Off. .

*Primary Examiner*—Timothy P. Callahan
*Assistant Examiner*—Jung Ho Kim
*Attorney, Agent, or Firm*—Herbert L. Lerner; Laurence A. Greenberg

[57] ABSTRACT

A power semiconductor component assembly includes a power semiconductor component having a semiconductor body. A controllable switch is connected to the power semiconductor component. A temperature sensor has a given reset time. The temperature sensor is connected to the controllable switch for turning on the controllable switch to control the power semiconductor component from a conducting state into a range of higher resistance once a temperature in the semiconductor body of the power semiconductor component attains a critical value. A delay member is connected between the temperature sensor and the controllable switch. The delay member is triggered upon response of the temperature sensor and has a delay time being longer than the given reset time, for preventing blocking of the controllable switch during the delay time.

3 Claims, 1 Drawing Sheet

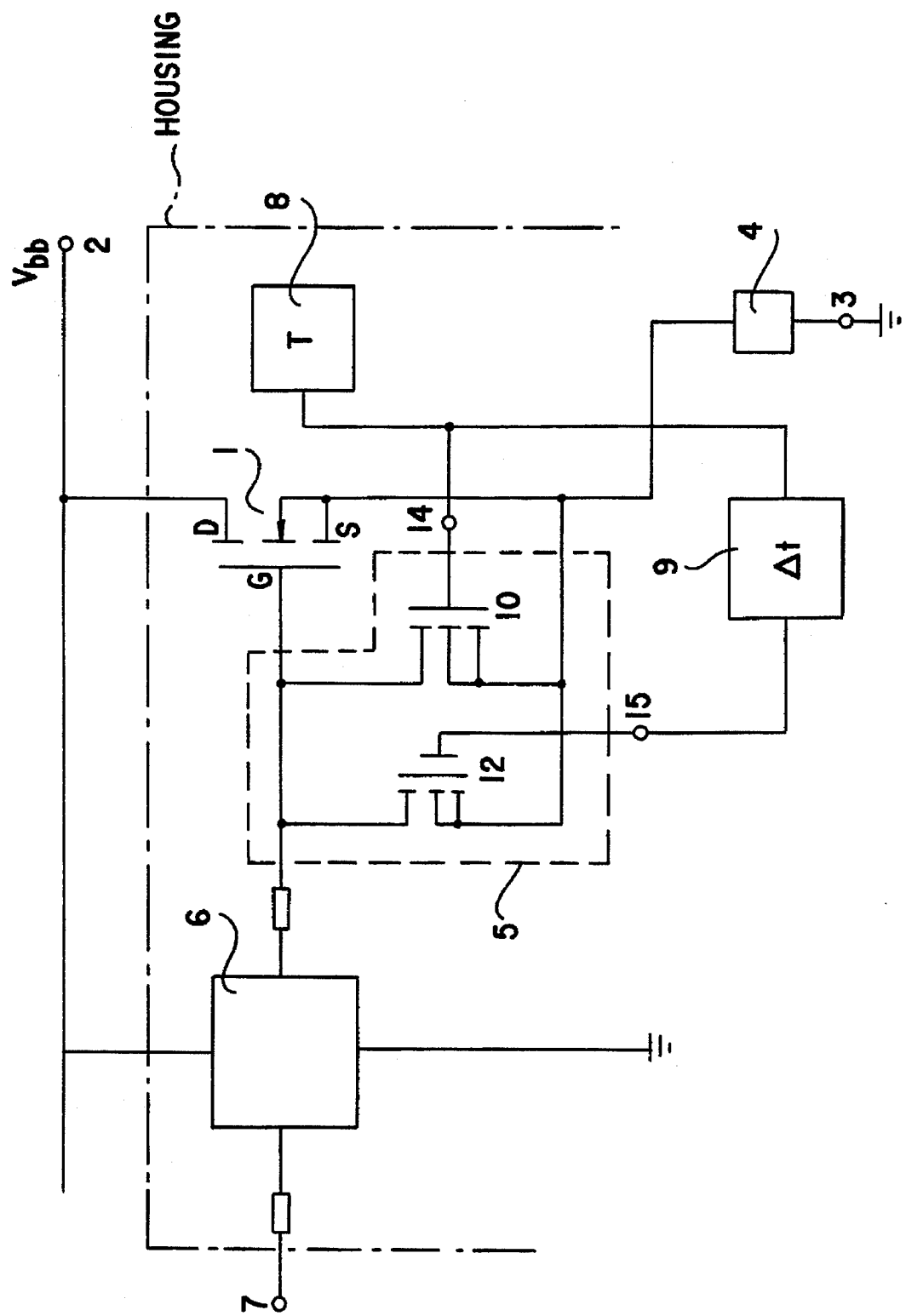

POWER SEMICONDUCTOR COMPONENT WITH TEMPERATURE SENSOR

BACKGROUND OF THE INVENTION

Field of the Invention

The invention relates to a power semiconductor component having a temperature sensor which turns on a controllable switch for controlling the power semiconductor component from a conducting state into a range of higher resistance once a temperature in a semiconductor body of the power semiconductor component attains a critical value.

One such power semiconductor component is described in European Patent No. 0 208 970 B1, corresponding to U.S. Pat. No. 4,937,646, for instance. The temperature sensor therein includes a thyristor, having an anode-to-cathode path which is connected between the gate terminal and the source terminal or cathode terminal of the power semiconductor component. The power semiconductor component may be a power MOSFET or an IGBT.

If the temperature of a power semiconductor component rises above a critical value of 160°, for instance, due to a short circuit of the load or an overload, then the temperature sensor short-circuits the control input of the power semiconductor component, turning the power semiconductor component off. Embodiments are also known in which the power semiconductor component is not turned off entirely but rather the gate-to-source voltage is merely reduced enough that the source current (cathode current) is reduced. If the temperature drops below the critical value, then the temperature sensor is reset, and the power semiconductor component again becomes conducting or is controlled to be fully conducting. However, if the short circuit or the overload is not overcome, then the temperature of the power semiconductor component rises again, until the critical temperature is reached. Due to the hysteresis of the temperature sensor, the turn-on temperature is generally only slightly below the turn-off temperature.

With that kind of turn-off behavior of the temperature sensor, a mean housing temperature is established that may be overly high for surface mounted components (SMD), for instance, since the boards can withstand a temperature of no more than 125° C. However, temperature sensors that switch at lower temperatures than 150° to 160° C., are only technologically achievable with effort and expense.

SUMMARY OF THE INVENTION

It is accordingly an object of the invention to provide a power semiconductor component with a temperature sensor, which overcomes the hereinafore-mentioned disadvantages of the heretofore-known devices of this general type and in which a housing is kept at a temperature that is considerably below a critical value, in the event of an overload or short circuit.

With the foregoing and other objects in view there is provided, in accordance with the invention, a power semiconductor component assembly, comprising a power semiconductor component having a semiconductor body; a controllable switch connected to the power semiconductor component; a temperature sensor having a given reset time, the temperature sensor being connected to the controllable switch for turning on the controllable switch to control the power semiconductor component from a conducting state into a range of higher resistance once a temperature in the semiconductor body of the power semiconductor component attains a critical value; and a delay member being connected between the temperature sensor and the controllable switch, the delay member being triggered upon response of the temperature sensor and having a delay time being longer than the given reset time, for preventing blocking of the controllable switch during the delay time.

In accordance with another feature of the invention, the power semiconductor component has a control input, the temperature sensor has an output, the delay member has an output, the controllable switch includes first and second transistors having load paths being connected parallel to one another and parallel to the control input of the power semiconductor component, the first transistor has a control terminal connected to the output of the temperature sensor, and the second transistor has a control terminal connected to the output of the delay member.

In accordance with a concomitant feature of the invention, the power semiconductor component has a housing, and the delay time sets a mean temperature of the housing at least at 20% below the critical value.

Other features which are considered as characteristic for the invention are set forth in the appended claims.

Although the invention is illustrated and described herein as embodied in a power semiconductor component with a temperature sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a schematic circuit diagram of an exemplary embodiment of the invention.

DESCRIPTION OF THE PREFERRED EMBODIMENTS

Referring now to the single FIGURE of the drawing in detail, there is seen a power MOSFET 1, to which a load 4 is connected in series on the source side. The series circuit including the power MOSFET and the load is connected to an operating voltage $V_{bb}$ through two terminals 2, 3. A temperature sensor 8 is in thermal contact with the power MOSFET and is preferably accommodated in the same housing. The temperature sensor may include a thyristor, as in the reference discussed at the outset. The temperature sensor 8 has an output, which is connected on one hand to an input 14 of a controllable switch 5 and on the other hand to a delay member 9. The power semiconductor component 1 is triggered by a control IC 6, having an input 7 at which an input signal is applied.

The power MOSFET is made conducting by the application of a control signal to the input 7 of the control IC 6. A current then flows from the terminal 2 to the terminal 3 through the MOSFET 1 and the load 4. If the temperature of the MOSFET 1 rises to from 150° to 160° C., as a result of a complete or partial short circuit of the load 4, then the temperature sensor 8 responds. A signal thus appears at the output of the temperature sensor 8 that on one hand makes the controllable switch 5 conducting through the input 14 and on the other hand triggers the delay member 9. A signal then likewise appears at an output of the delay member 9, which is located at an input 15 of the controllable switch 5. The controllable switch performs an OR function and prevents turn-on of the MOSFET 1 until such time as a signal is present at one or both of the inputs 14, 15.

The delay time of the delay member 9 is longer than the time after which the temperature sensor 8 is reset again. The delay member 9 is dimensioned in such a way that the MOSFET 1 remains blocked until such time as a mean temperature that is considerably below the critical temperature at which the temperature sensor 8 responds is established in its semiconductor body and therefore at its housing. The word "considerably" in this case means that the mean temperature of the housing is supposed to be below the critical temperature by at least 20%, and for instance by from 30° to 40°. The temperature can be established by selection of the magnitude of a time lag $\Delta t$. No measurement of the critical housing temperature takes place. After the time lag $\Delta t$ has elapsed, the controllable switch 5 is blocked, and the power semiconductor component 1 can be turned on again.

As is shown in the drawing, the controllable switch may include first and second MOSFETs 10, 12, having drain-to-source paths (or load paths) which are connected parallel to one another. Both load paths are connected between the gate terminal and the source terminal of the MOSFET 1. The gate terminal of the MOSFET 10 is connected directly through the input 14 to the output of the temperature sensor 8. The gate terminal of the MOSFET 12 is connected directly through the input 15 to the output of the delay member 9.

We claim:

1. A power semiconductor component assembly, comprising:

a power semiconductor component having a semiconductor body;

a controllable switch connected to said power semiconductor component;

a temperature sensor having a given reset time, said temperature sensor being connected to said controllable switch for turning on said controllable switch to control said power semiconductor component from a conducting state into a range of higher resistance once a temperature in said semiconductor body of said power semiconductor component attains a critical value; and a delay member being connected between said temperature sensor and said controllable switch, said delay member being triggered by said temperature sensor and having a delay time being longer than said given reset time, for preventing blocking of said controllable switch during said delay time.

2. The power semiconductor component assembly according to claim 1, wherein said power semiconductor component has a control path, said temperature sensor has an output, said delay member has an output, said controllable switch includes first and second transistors having load paths being connected parallel to one another and connected to the control path of said power semiconductor component, said first transistor has a control terminal connected to said output of said temperature sensor, and said second transistor has a control terminal connected to said output of said delay member.

3. The power semiconductor component assembly according to claim 1, wherein said power semiconductor component has a housing which is thermally connected to said power semiconductor component, and said delay time sets a mean temperature of said housing at least at 20% below the critical value.

* * * * *